US006107200A

United States Patent [19]

Takagi et al.

[11] Patent Number: 6,107,200

[45] Date of Patent: Aug. 22, 2000

[54] SEMICONDUCTOR DEVICE MANUFACTURING METHOD

[75] Inventors: Hideo Takagi; Hiroki Iio; Yuzuru Ota, all of Kanagawa, Japan

[73] Assignee: Fujitsu Limited, Kawasaki, Japan

[21] Appl. No.: 09/265,399

[22] Filed: Mar. 10, 1999

[30] Foreign Application Priority Data

Mar. 12, 1998 [JP] Japan .................................. 10-060249

[51] Int. Cl.[7] ........................ H01L 21/44; H01L 21/4763

[52] U.S. Cl. .......................... 438/685; 438/597; 438/629; 257/748; 257/751; 257/768

[58] Field of Search .................................... 438/685, 597, 438/629; 257/748, 751, 768

[56] References Cited

FOREIGN PATENT DOCUMENTS 8-264530 10/1996 Japan .

*Primary Examiner*—Tom Thomas
*Assistant Examiner*—Bernard E. Souw
*Attorney, Agent, or Firm*—Armstrong, Westerman, Hattori, McLeland & Naughton

[57] ABSTRACT

The semiconductor device manufacturing method includes the step of forming a second tungsten film on a first tungsten film, which is formed by using a reduction gas not-containing diborane, by using a gas containing the diborane, or forming the second tungsten film on the first tungsten film after the first tungsten film has been exposed to the gas containing the diborane.

15 Claims, 7 Drawing Sheets

SEMICONDUCTOR DEVICE MANUFACTURING METHOD

BACKGROUND OF THE INVENTION

1. Field of the Invention

The present invention relates to a method of forming tungsten employed as a wiring or a buried layer in a contact hole.

2. Description of the Prior Art

With the progress of high integration of a DRAM (Dynamic Random Access Memory) and a logic LSI in recent years, a diameter of a contact hole formed in an interlayer insulating film to connect an overlying wiring layer and an underlying wiring layer is reduced, and also a width of a buried wiring layer in an insulating film is miniaturized. Thus, aspect ratios of the contact hole and the wiring layer are increasing.

Using effectively characteristics of tungsten which has lower resistance than silicide or silicon and is proof against high temperature heat treatment, a tungsten wiring layer is employed as one of wiring layers of the DRAM and others. For example, the tungsten wiring layer is employed as a word line which contacts electrically a gate electrode, which is formed of a laminated structure (polycide) of polysilicon and tungsten silicide, a wiring layer which contacts electrically an $N^+$-type silicon layer and a $P^+$-type silicon layer of peripheral circuits, and the like.

Normally, the tungsten wiring layer is grown by reducing tungsten halide such as $WF_6$, etc. by using a hydrogen gas or a hydride gas such as silane ($SiH_4$), disilane ($Si_2H_6$), phosphine ($PH_3$), diborane ($B_2H_6$), etc. and a hydrogen mixed gas or a hydride mixed gas. However, when the tungsten film is formed by reduction action using hydrogen or hydride, normally its resistivity is relatively high like 15 $\mu\Omega$cm. Thus, an electric resistance of the tungsten wiring layer employing such tungsten film becomes high.

Therefore, since the resistivity of the tungsten film is low like 8 to 10 $\mu\Omega$cm if the film is formed by executing the reduction using a gas into which diborane in hydride is mixed, the resistance of the tungsten wiring layer can be relatively reduced. Thus, the tungsten wiring layer formed by such growth method is being observed with interest. Such technology is set forth in Patent Application Publication (KOKAI) Hei 4-74865, for example.

The diborane must be employed in such technology. Nevertheless, actually it is possible to grow the tungsten film by mixing a very small amount of diborane into hydrogen, etc. and thus it is not always needed to employ diborane as a main component. However, for convenience of explanation, a reduction method which employs a hydrogen gas or a hydride gas into which diborane is mixed, a mixed gas containing hydrogen and diborane, or a mixed gas containing hydride and diborane is called a "diborane reduction method" in the following description. Also, sometimes a reduction method which employs the hydrogen gas or the hydride gas, a hydrogen mixed gas, or a hydride mixed gas, into which diborane is not mixed, is called a "hydrogen reduction method".

FIG. 1 is a sectional view showing an example of a semiconductor device in which the tungsten film which is grown by the diborane reduction method is employed as a wiring layer which is brought into contact with source/drain diffusion layers. In FIG. 1, a reference 101 denotes a silicon substrate; 102, an element isolation LOCOS oxide film; 103, a gate oxide film; 104, a gate electrode; 105 and 106, low impurity concentration diffusion layers; 107 and 108, high impurity concentration diffusion layers; 109, an insulating film for covering a periphery of the gate; 110, an interlayer insulating film; 111, a double-layered film formed of TiN and Ti; and 112, a tungsten film grown by the diborane reduction method. The diffusion layers 105, 107 and the diffusion layers 106, 108 serve alternatively as a source region and a drain region in an LDD (Lightly Doped Drain) structure. The double-layered film 111 formed of TiN and Ti is formed to improve adhesiveness between the tungsten film 112 and the interlayer insulating film 110. An upper layer of the double-layered film 111 is formed of TiN to improve the adhesiveness, while a lower layer thereof is formed of Ti to contact the diffusion layer 106. The insulating film 109 covering a periphery of the gate electrode is employed in the step of forming an MOS transistor with the LDD structure, or the step of opening the contact hole in the interlayer insulating film 110 by a self-alignment contact method.

In the meanwhile, the interlayer insulating film 110 is employed to isolate and separate the diffusion layer 106 and the upper wiring layer 112 and also the gate electrode 104 and the upper wiring layer 112 respectively. In addition, in the case of the dynamic RAM, an insulating layer which separates a capacitor structure (not shown) of a stacked capacitor from the upper wiring layer 112 is stacked on the interlayer insulating film 110. In such case, a thickness of the interlayer insulating film 110 must be formed thicker by the stacked capacitor structure.

The interlayer insulating film having a multi-layered structure is also employed in the logic LSI as well as the memory semiconductor device. Also, it is not preferable to thin the interlayer insulating film because its parasitic capacitance is increased, so that the interlayer insulating film needs a thickness to some extent.

On the contrary, reduction in a diameter of the contact hole is requested according to miniaturization of the device. Therefore, there is such a tendency that an aspect ratio (b/a), which is a ratio of a contact hole depth b to a contact hole diameter a, is increased.

FIG. 2 is a view showing a shape of the tungsten film formed when the aspect ratio is increased. FIG. 2 is a view showing schematically a SEM photograph after a sectional shape obtained when the tungsten film 112 is formed in a hole, which has a diameter of 0.25 $\mu$m and a depth of 2.0 $\mu$m, by using the diborane reduction method is taken by the SEM photograph. In FIG. 2, the adhesive layer 111 is provided.

As can be seen from FIG. 2, in the case of the high aspect ratio such that the aspect ratio is about 8 (2.0/0.25), the tungsten film is seldom formed on a bottom portion and a peripheral portion of the contact hole.

Accordingly, in the structure shown in FIG. 1, when the aspect ratio is increased because the diameter of the contact hole on the diffusion layer 106 is reduced with respect to the thickness of the interlayer insulating film 110, the tungsten film 112 cannot contact the diffusion layer 106.

Such phenomenon appears in the tungsten film which is grown by the diborane reduction method remarkably rather than the tungsten film which is grown by the hydrogen reduction method. In other words, the tungsten film which is formed by the diborane reduction method has lower resistivity but has poorer coverage on the stepped portion than the tungsten film which is grown by the reduction action using other hydride or hydrogen. Hence, if growth of the tungsten film employing the diborane reduction method is applied to the minute contact hole which has the high aspect ratio, the tungsten film is difficult to grow on the side wall and the bottom surface of the contact hole and thus there is a high possibility that disconnection of the wiring is caused.

If the tungsten film which is formed by using other hydride or hydrogen in place of diborane as the reduction gas is employed, such disconnection of the wiring can be avoided. However, as described foregoing, since the tungsten film which is grown by the hydrogen reduction method has the high resistivity of 15 $\mu\Omega$cm, the resistance of tungsten is enhanced even when the tungsten film can contact to the underlying conductive layer. As a result, it is impossible to use the tungsten film as the wiring layer as it is.

In contrast, it may be thought of that, in the tungsten film grown by the hydrogen reduction method, a film thickness is made thick to have the resistance equivalent to that of the tungsten film grown by the diborane reduction method. However, such problems have arisen that not only throughput is reduced because it takes a lot of time to etch the tungsten film, but also the wiring layer cannot be formed with good precision because a retreat amount of the resist is increased during etching.

SUMMARY OF THE INVENTION

It is an object of the present invention to provide a semiconductor device manufacturing method employed to form a tungsten wiring layer which has excellent coverage and a low resistance value, and can be patterned with good precision.

According to the present invention, the above problem can be overcome by forming a second tungsten film by using the diborane reduction method on a first tungsten film formed by the hydrogen reduction method and then employing the first tungsten film and the second tungsten film as the wiring.

A contact resistance between the wiring obtained as above and its underlying conductive layer can be reduced lower than that of the wiring formed only by the second tungsten film. In addition, its sheet resistance can be lowered rather than the wiring formed only by the first tungsten film to a level of the wiring formed only by the second tungsten film. Moreover, according to the wiring of the present invention, coverage in the through hole can be improved by the first tungsten film and also disconnection of the wiring is hard to be caused.

According to another invention, the above problem can be overcome by forming the first tungsten film by using the hydrogen reduction method, then exposing a surface of the first tungsten film to the diborane atmosphere, and then forming the second tungsten film on the first tungsten film by using the hydrogen reduction method or the diborane reduction method, whereby the wiring is formed by the first tungsten film and the second tungsten film.

It has been confirmed according to the experiments that the sheet resistance of the wiring obtained as above is identical to or substantially coincides with that of the wiring formed only by the second tungsten film. Moreover, according to the above wiring, coverage in the through hole can be improved by the first tungsten film and also disconnection of the wiring is hard to be caused.

The following reason can be thought of as a cause of reduction in the sheet resistance of such wiring.

If diameters of crystal grains are compared between the tungsten film which is grown by the hydrogen reduction method and the tungsten film which is grown by the diborane reduction method, the diameter of the crystal grain of the tungsten film grown by the diborane reduction method is larger than that of the tungsten film grown by the hydrogen reduction method. This is because the resistance of the tungsten film grown by the diborane reduction method is low. In addition, it has been confirmed by the inventors of the present invention that, if the diborane atmosphere process is applied to the surface of the tungsten thin film grown by the hydrogen reduction method, an amorphous layer is formed on the surface of the tungsten thin film. This surface layer is supposed to be tungsten boride (WB) based on the result of Auger analysis. It is also supposed that, since the surface layer is formed, the diameter of the crystal grain of the tungsten film grown on the surface layer becomes large even if the tungsten film is grown by the hydrogen reduction method.

DESCRIPTION OF THE PREFERRED EMBODIMENTS

Figure 1:
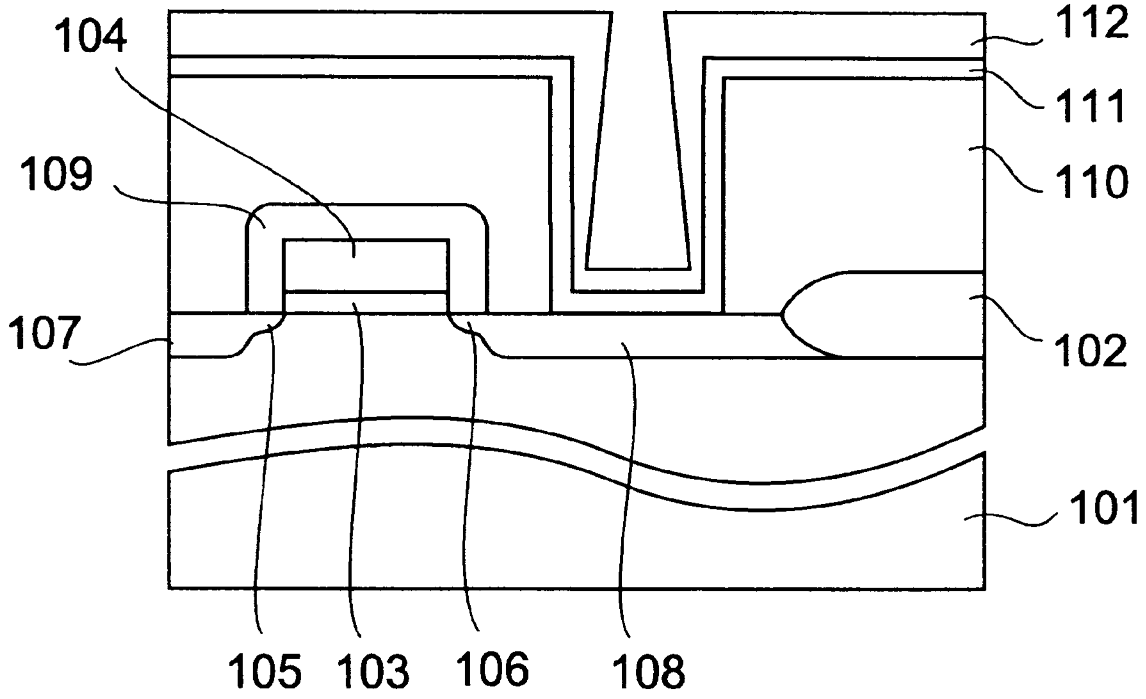
FIG. 1 is a sectional view showing a semiconductor device in the prior art.
Figure 2:
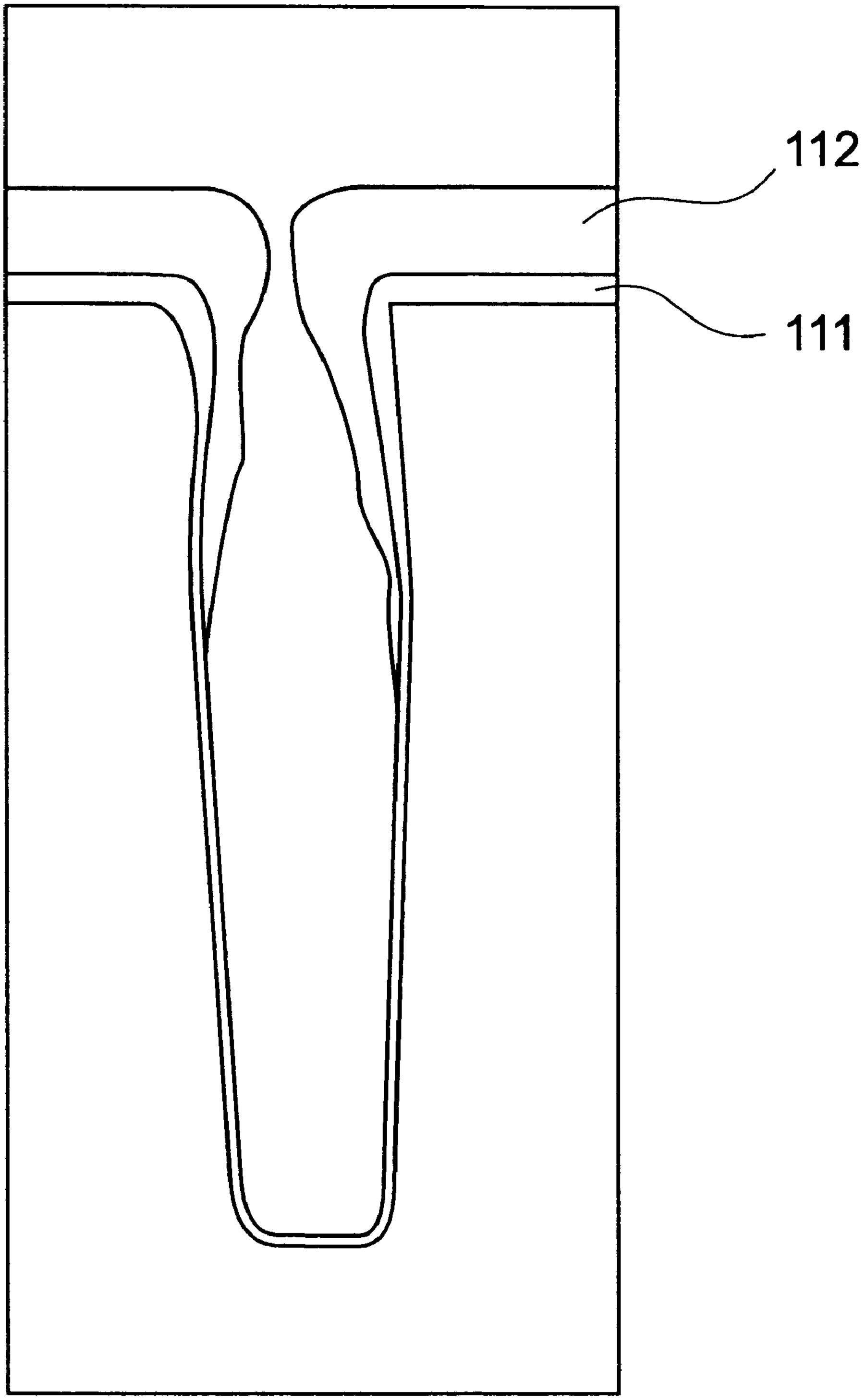
FIG. 2 is a view showing the problem existed in the prior art.

First, the inventors of the present invention have checked differences in the contact resistance and the wiring resistance due to the tungsten wiring structure according to experiments under various conditions.

In the semiconductor substrate employed as a sample to examine difference in the contact resistance, an insulating layer of 2.0 $\mu$m thickness which has a contact hole of 0.25 $\mu$m diameter therein is formed on a semiconductor substrate. Then, a contact resistance between a P-type impurity diffusion layer which is formed in the semiconductor substrate and a tungsten wiring layer which is formed on the insulating layer to pass through the contact hole has been examined by the Kelvin contact method. Also, resistance of the tungsten wiring has been evaluated by measuring its sheet resistance by virtue of the four-point probe method.

The P-type impurity diffusion layer is activated by annealing at 950° C. for 60 seconds after $BF^{2+}$ ions have been implanted into the semiconductor substrate at an acceleration energy of 15 keV and a dosage of $5\times10^{15}$ $cm^{-2}$.

Ti of 20 nm thickness is formed previously as a contact metal below the tungsten wiring layer which is formed on the insulating layer and in the contact hole. TiN of 40 nm thickness is formed previously as an adhesive layer between the tungsten wiring layer and the contact metal.

In this case, the term "sccm" which is employed as unit of flow rate in following experimental examples and embodiments is an abbreviation of the standard cubic centimeter per minute. The "sccm" represents a flow rate per one minute by using "cc" under standard conditions, and is widely used as a unit of the flow rate in a mass flowmeter.

Experiment 1

① Sample 1 (Tungsten film grown by the hydrogen reduction method)

As the tungsten film forming conditions in the sample 1, $WF_6$, $H_2$, and Ar are flown into the growth atmosphere at flow rates of 25 sccm, 1500 sccm, and 200 sccm respectively, the substrate temperature is set to 475° C., and the pressure of the atmosphere is set to 80 Torr. Under such conditions, the tungsten film is formed to have a thickness of 150 nm. The contact resistance between the tungsten film and the P-type impurity diffusion layer has been able to be reduced below 500Ω, but the sheet resistance of the tungsten film has been 1.0 Ω/□.

② Sample 2 (Tungsten film grown by the diborane reduction method)

As the tungsten film forming conditions in the sample 2, $WF_6$, $H_2$, $B_2H_6$, and Ar are flown into the growth atmosphere at flow rates of 25 sccm, 1500 sccm, 2 sccm, and 200 sccm respectively, the substrate temperature is set to 475° C., and the pressure of the atmosphere is set to 80 Torr. Under such conditions, the tungsten film is formed to have the thickness of 150 nm. The sheet resistance of the tungsten film has been able to be reduced to 0.6 Ω/□, but the contact resistance between the tungsten film and the P-type impurity diffusion layer has been slightly high like 700 to 1000Ω.

③ Sample 3 (Tungsten film is grown by the diborane reduction method on the tungsten film which is grown by the hydrogen reduction method)

The tungsten film forming conditions in the sample 3 are given as follows.

To begin with, $WF_6$, $H_2$, $SiH_4$, and $N_2$ are supplied to the growth atmosphere at the flow rates of 10 sccm, 100 sccm, 4 sccm, and 300 sccm respectively, the substrate temperature is set to 450° C., the pressure of the atmosphere is set to 3 Torr, and the first tungsten film of 30 nm thickness is grown on the insulating film. Then a surface of first tungsten film is exposed to an atmosphere containing $H_2$, $B_2H_6$, and Ar supplied at flowrates of 1500 sccm, 2 sccm, and 200 sccm respectively, and the pressure of atmosphere is set to 80 Torr.

Then, the second tungsten film is formed on the first tungsten film. This second tungsten film is formed to have a thickness of 150 nm under the conditions that $WF_6$, $H_2$ and Ar are supplied to the growth atmosphere at the flow rates of 25 sccm, 1500 sccm and 200 sccm respectively, the substrate temperature is set to 475° C. and the pressure of the atmosphere is set to 80 Torr. The contact resistance of the double-layered tungsten film is 300 to 500Ω, and can be lower than the single tungsten film which is grown by the diborane reduction method. The sheet resistance of the double-layered tungsten film is 0.6 Ω/□ which is lower than the single tungsten film which is grown by the hydrogen reduction method. This sheet resistance can be lowered to the same level as the tungsten film which is grown by the diborane reduction method.

It can be seen from three samples mentioned above that preferably the multi-layered structure consisting of the tungsten film which is grown by the hydrogen reduction method and the tungsten film which is grown by the diborane reduction method should be employed as the wiring layer.

Experiment 2

② Sample 1 (Tungsten film is grown by the hydrogen reduction method on the tungsten film which is grown by the hydrogen reduction method. Where no process is effected in the diborane atmosphere.)

The tungsten film forming conditions in the sample 1 are given in the following.

First, the first tungsten film is grown on the insulating film to have a thickness of 30 nm while $WF_6$, $SiH_4$, and $N_2$ are supplied to the growth atmosphere at flow rates of 10 sccm, 4 sccm, and 300 sccm respectively, the substrate temperature is set to 450° C., and the pressure of the growth atmosphere is set to 3 Torr. Then, the second tungsten film is formed on the first tungsten film. This second tungsten film is formed to have a thickness of 130 nm while $WF_6$, $H_2$, and Ar are supplied to the growth atmosphere at flow rates of 25 sccm, 1500 sccm, and 200 sccm respectively, the substrate temperature is set to 450° C., and the pressure of the growth atmosphere is set to 80 Torr.

The sheet resistance of the double-layered tungsten film in the sample 1 has been 1.1 Ω/□.

② Sample 2 (Tungsten film is grown by the diborane reduction method on the tungsten film which is grown by the hydrogen reduction method. Where the process is effected in the diborane atmosphere in the middle of the growth of the tungsten film.)

The tungsten film forming conditions in the sample 2 are given as described hereinbelow.

First, the first tungsten film is grown on the insulating film to have a thickness of 30 nm while $WF_6$, $SiH_4$, and $N_2$ are supplied to the growth atmosphere at flow rates of 10 sccm, 4 sccm, and 300 sccm respectively, the substrate temperature is set to 450° C., and the pressure of the growth atmosphere is set to 3 Torr, and then a surface of the first tungsten film is exposed to the diborane containing atmosphere. $H_2$, $B_2H_6$, and Ar are supplied at the flow rates of 1500 sccm, 2 scam, and 200 sccm to the diborane containing atmosphere. In the event that the first tungsten film is exposed to the diborane atmosphere, the substrate temperature is set to 475° C., and the pressure of the growth atmosphere is set to 80 Torr.

After the first tungsten film is exposed to the diborane atmosphere like the above, the second tungsten film is formed on the first tungsten film. This second tungsten film is formed to have a thickness of 130 nm while $WF_6$, $H_2$, $B_2H_6$, and Ar are supplied to the growth atmosphere at flow rates of 25 sccm, 1500 sccm, 2 sccm, and 200 sccm respectively, the substrate temperature is set to 475° C., and the pressure of the growth atmosphere is set to 80 Torr.

The sheet resistance of the wiring layer consisting of the first tungsten film and the second tungsten film has been 0.6 Ω/□. As a result, it has been found that, regardless of the fact that the surface of the first tungsten film is exposed to the diborane or not, the sheet resistance of this wiring corresponds substantially to that of the tungsten film which is grown by the diborane reduction method.

③ Sample 3 (Tungsten film is grown by the hydrogen reduction method on the tungsten film which is grown by the hydrogen reduction method. Where the process of exposing a surface of the tungsten film to the diborane atmosphere is effected in the middle of the growth of the tungsten film.)

The tungsten films in the sample 3 have been formed under following conditions.

First of all, the first tungsten film is grown on the insulating film to have a thickness of 30 nm while $WF_6$, $SiH_4$, and $N_2$ are supplied to the growth atmosphere at the flow rates of 10 sccm, 4 sccm, and 300 sccm respectively, the substrate temperature is set to 450° C., and the pressure of the growth atmosphere is set to 3 Torr, and then a surface of the first tungsten film is exposed to the diborane containing atmosphere. In the diborane containing atmosphere, $H_2$, $B_2H_6$, and Ar are supplied at the flow rates of 1500 sccm, 2 sccm, and 200 sccm, and the pressure of the atmosphere is set to 80 Torr. In this atmosphere, the substrate temperature is set to 475° C.

Then, the second tungsten film is formed on the first tungsten film to have a thickness of 130 nm while $WF_6$, $H_2$, and Ar are supplied to the growth atmosphere at flow rates of 25 sccm, 1500 sccm, and 200 sccm respectively, the substrate temperature is set to 475° C., and the pressure of the growth atmosphere is set to 80 Torr.

The sheet resistance of the tungsten film being formed by switching the atmosphere as mentioned above has been 0.62 Ω/□, which corresponds substantially to that of the tungsten film which is grown by the diborane reduction method.

With the above, it is effective for reduction in the resistance of the tungsten film to expose the surface of the tungsten film to the diborane after the tungsten film has been formed by the hydrogen reduction method.

The reason why difference in the sheet resistance is caused depending upon that the process of exposing the surface to diborane is carried out in the middle of growth of the tungsten film or not can be considered as follows.

It has been found that, if diameters of crystal grains are compared between the tungsten film which is grown by the hydrogen reduction method and the tungsten film which is grown by the diborane reduction method, the diameter of the crystal grain of the tungsten film grown by the diborane reduction method is larger than that of the tungsten film grown by the hydrogen reduction method. It seems that the lower resistance of the tungsten film grown by the diborane reduction method is caused by such larger crystal grain.

While, it has been confirmed that, if the surface of the tungsten thin film grown by the hydrogen reduction method is exposed to the diborane containing atmosphere, an amorphous layer is formed on the surface of the tungsten thin film. This amorphous layer is supposed to be tungsten boride (WB) based on the result of Auger analysis. It is also considered that, since the amorphous layer is formed on the surface of the tungsten film, the diameter of the crystal grain of the tungsten film which is grown succeedingly becomes large even if such film is grown by the hydrogen reduction Accordingly, it seems that the reason why the sheet resistance of the sample 3 becomes lower than that of the sample 1 in the above experiment 2 is that the grain diameter of the second tungsten film to be formed on the first tungsten film can be increased by exposing the first tungsten film to the diborane atmosphere, so that an overall resistance of the tungsten can be reduced.

Then, embodiments of the present invention will be explained in more detail based on the above experiments hereinafter.

To begin with, a first embodiment of the present invention will be explained with reference to FIGS. 3A to 3D hereunder.

Figure 3A:
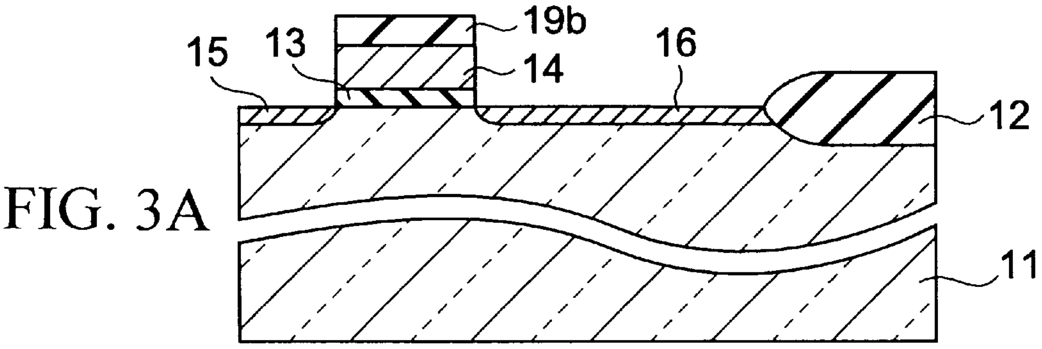
FIGS. 3A to 3D are sectional views showing the steps of manufacturing the semiconductor device according to the first embodiment of the present invention.
Figure 3B:
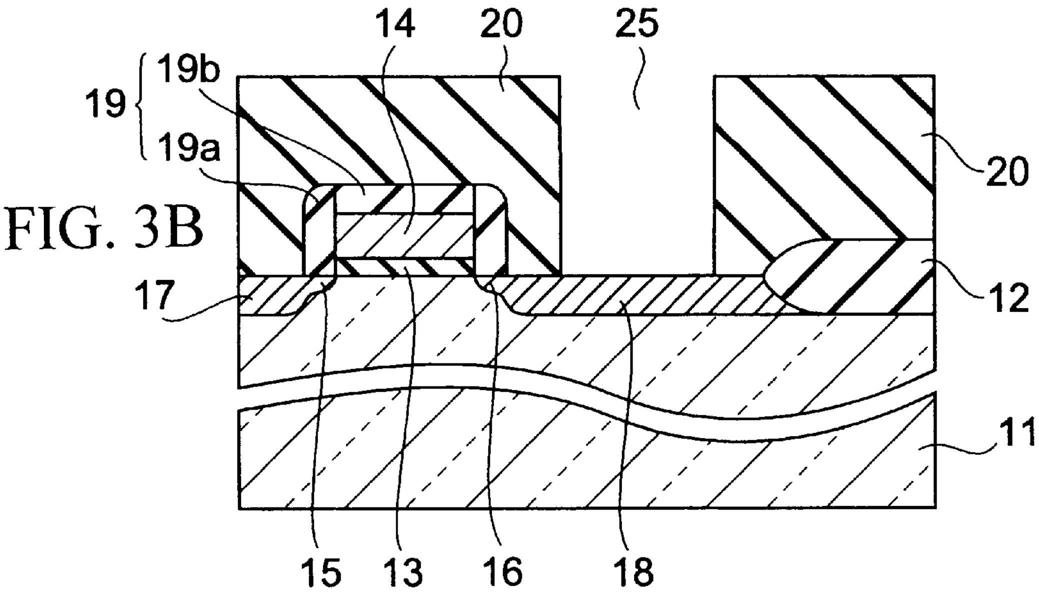
Figure 3C:
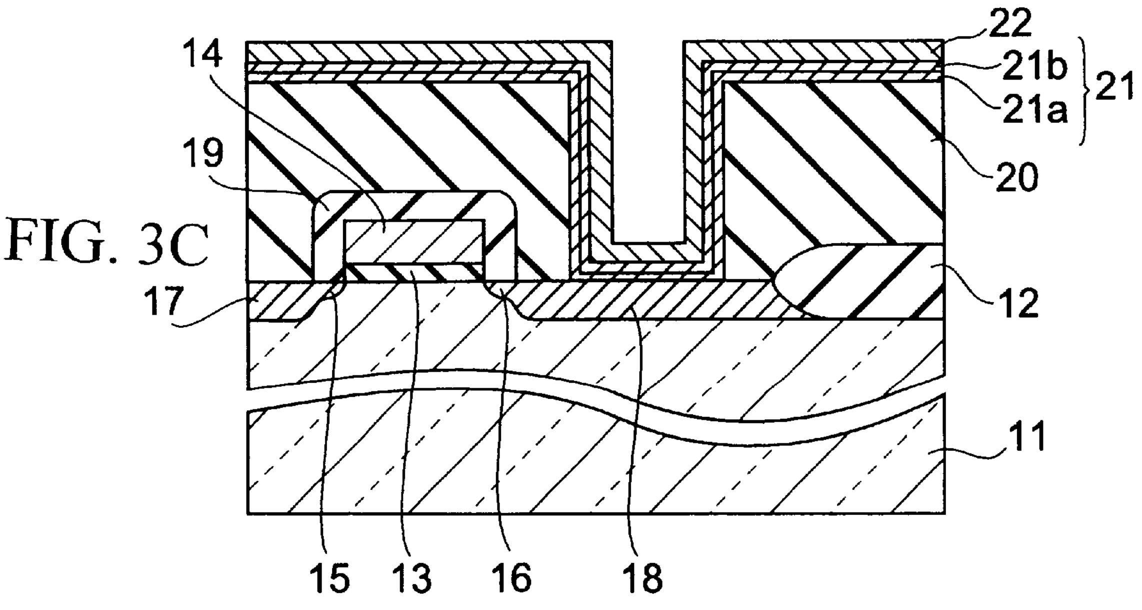
Figure 3D:
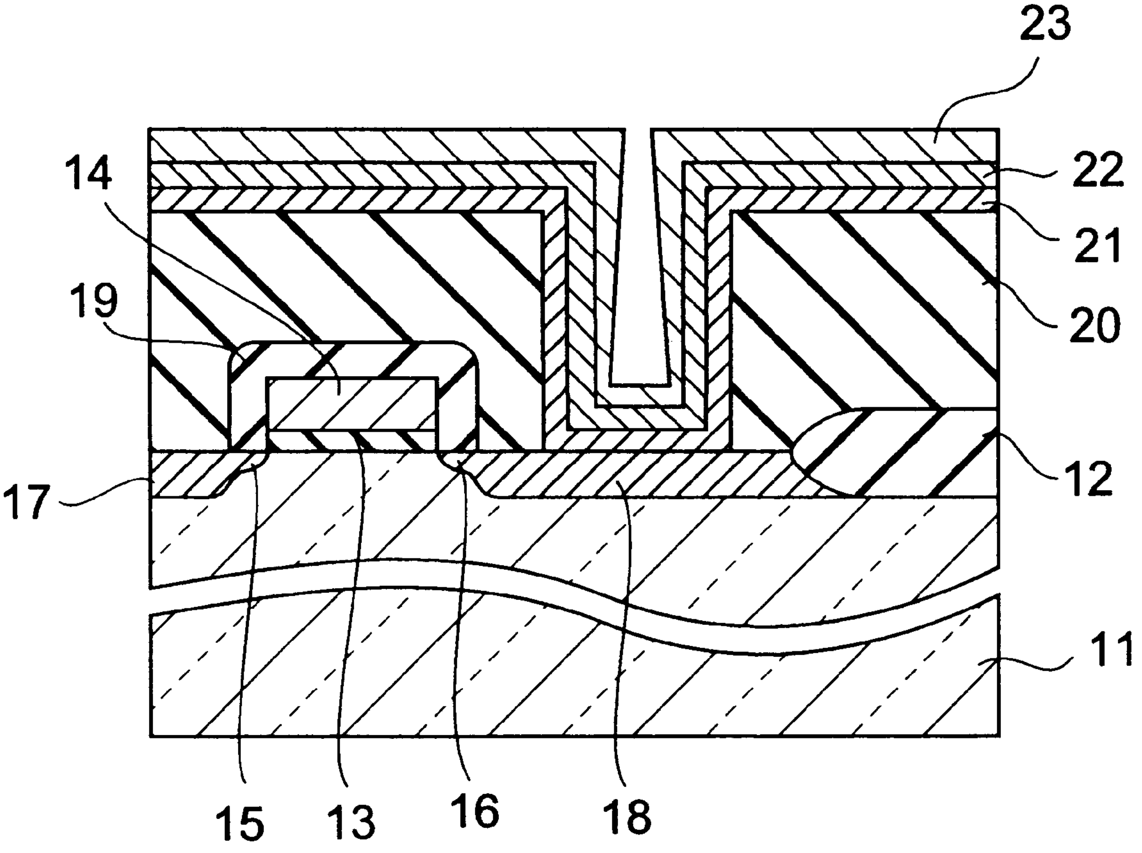

In FIG. 3D, a reference 11 denotes a silicon (Si) substrate. An element isolation LOCOS oxide film 12 is formed on a surface of the silicon substrate 11. A gate electrode 14 is formed on the silicon substrate 11 via a gate oxide film 13 in the region which is surrounded by the LOCOS oxide film 12.

Impurity diffusion layers serving as the source/drain regions of the LDD structure, which are formed by low concentration impurity diffusion layers 15, 16 and high concentration impurity diffusion layers 17, 18, are formed on the silicon substrate 11 on both sides of the gate electrode 14. A sidewall 19*a* formed of an insulating film is formed around the gate electrode 14. An insulating film 19b is formed on the gate electrode 14.

AN MOS transistor, which consists of the gate electrode 14 and the impurity diffusion layers, and the LOCOS oxide film 12 are covered with an interlayer insulating film 20. A hole 20*a* which is connected to one of the impurity diffusion layers of the LDD structure is formed in the interlayer insulating film 20.

An underlying metal film 21 formed as a double-layered structure of TiN and Ti is formed on the interlayer insulating film 20 and in the hole 20*a*. A first tungsten film 22 which is formed by the hydrogen reduction method and a second tungsten film 23 which is formed by the diborane reduction method are formed in sequence on the underlying metal film 21.

In this case, the underlying metal film 21 formed of TiN and Ti has the same function as that explained in the prior art, and is formed to improve adhesiveness between the first tungsten film 22 and the interlayer insulating film 20. The upper TiN layer is an adhesive layer, and the lower Ti layer is a contact layer for the diffusion layer 18. The sidewall 19*a* and the insulating film 19*b* which cover a periphery of the gate electrode 14 are employed to form the impurity diffusion layers of the LDD structure and to open a contact hole according to the self-alignment contact method in this embodiment.

Subsequently, a semiconductor device manufacturing method of the present invention will be explained with reference to FIGS. 3A to 3D hereunder.

To begin with, as shown in FIG. 3A, with the use of the well-known LOCOS method, a field oxide film 12 which surrounds an element forming region is formed on a surface of the P-type silicon (Si) substrate 11 to have a thickness of 250 nm. A gate oxide film 13 of 6 nm thickness is then grown by oxidizing the surface of the silicon substrate 11 in an oxidation atmosphere. A polysilicon film of 50 nm thickness and a tungsten silicide ($WSi_2$) film of 100 nm thickness are then formed on the gate oxide film 13 and the field oxide film 12 by the CVD method, whereby a polycide structure is formed. After this, an $SiO_2$ film 19*b* is formed on the $WSi_2$ film by the CVD method to have a thickness of 50 nm.

The $SiO_2$ film, the $WSi_2$ film, and the Si film are then patterned by using the well-known photolithography method to thus form the gate electrode 14 consisting of the $WSi_2$ film and the Si film. In this case, the $SiO_2$ film 19*b* which has the same planar shape as the gate electrode 14 is formed on the $WSi_2$ film constituting the gate electrode 14.

While using the gate electrode 14 and the field oxide film 12 as a mask, phosphorus ions ($P^+$) are introduced into an n-channel MOS transistor forming region of the silicon substrate 11 by the ion-implantation method under the conditions the energy is set to 20 keV and the dosage is set to $2\times10^{13}$ $cm^{-2}$. Thus, low concentration impurity diffusion layers 15, 16 acting as the low concentration source/drain regions are formed on both sides of the gate electrode 14.

In this case, a p-channel MOS transistor forming region may be covered with a mask such as resist to prevent entering of the phosphorus ions.

Then, as shown in FIG. 3B, an $SiO_2$ film of 100 nm thickness is formed on the gate electrode 14, the low concentration impurity diffusion layers 15, 16, and the field oxide film 12 by the CVD method, and then anisotropic etching is applied to the $SiO_2$ film by the reactive ion etching to remain on the side wall of the gate electrode 14. This remained $SiO_2$ film is employed as a sidewall 19*a*.

While using the sidewall 19*a* and the field oxide film 12 as a mask, arsenic ions ($As^+$) are then introduced into the n-channel MOS transistor forming region of the silicon substrate 11 under the conditions the energy is set to 15 keV and the dosage is set to $4\times10^{15}$ $cm^{-2}$. Thus, high concentration impurity diffusion layers 17, 18 acting as the high concentration source/drain regions are formed. As a result, the source/drain regions of the LDD structure can be formed by the high concentration impurity diffusion layers 17, 18 and the low concentration impurity diffusion layers 15, 16.

In this case, regions, e.g., a memory cell region, etc. in which the n-type impurity diffusion region of high concentration would not be formed may be covered appropriately with a mask to prevent the ion implantation. Thus, the high concentration region is not formed there.

Then, though not shown, high concentration impurity diffusion layers acting as source/drain regions are formed by introducing boron fluoride ions ($BF_2^+$) into a p-channel MOS transistor forming region under the conditions the energy is set to 15 keV and the dosage is set to $5\times10^{15}$ $cm^{-2}$. Thus, a p-channel MOS transistor is formed.

Then, though not shown, bit lines of the polycide structure formed of a polysilicon layer and a $WSi_2$ film, for example, and a capacitor structure are formed in the memory cell region. An interlayer insulating film 20 which covers the transistor, the field oxide film 12, etc. is then formed on the silicon substrate 11.

The interlayer insulating film 20 for covering the transistor, the field oxide film 12, etc. is formed as a combined film of an insulating film between the bit line and the memory cell region, a capacitor insulating film, an insulating film between the capacitor and the bit line, and an insulating film formed after the capacitor structure is formed. A total thickness of the interlayer insulating film 20 is about 2 $\mu$m. These insulating films are employed in the well-known memory manufacturing process, and an $Si_3N_4$ film, a PSG film, a BPSG film, an $SiO_2$ film, etc. are employed. Also, the plasma CVD method and the HDP (High Density Plasma) CVD method in addition to the thermal CVD method may be employed as the growth method. A surface of the interlayer insulating film 20 may be planarized by using the CMP (Chemical Mechanical Polishing) method.

A contact hole 25 of 0.25 $\mu$m diameter is then formed in the interlayer insulating film 20 located on the high concentration impurity diffusion layer 18 by using the well-known photolithography method. Then, as shown in FIG. 3C, the Ti film 21*a* of 20 nm thickness serving as the contact metal is formed by the plasma CVD method, and then the TiN film 21*b* of 40 nm thickness serving as the adhesive layer is formed by the thermal CVD method. The Ti film 21*a* and the TiN film 21*b* can be formed in the same chamber. At that time, the growth temperature of the Ti film 21*a* is set to 570° C. and $TiCl_4$ and hydrogen are employed as a material gas. Also, the growth temperature of the TiN film 21*b* is set to 630° C. and $TiCl_4$ and ammonia are employed as a material gas.

The first tungsten film 22 is then formed by the hydrogen reduction method using the CVD by a thickness of 30 nm. As the growth conditions, gases introduced into the growth atmosphere and their flow rates are set such that WF6 is 5 to 40 sccm (e.g., 10 sccm), $SiH_2$ is 1 to 10 sccm (e.g., 4 sccm), $N_2$ or Ar is 50 to 500 sccm (e.g., $N_2$ is 300 sccm), and $H_2$ is 50 to 500 sccm (e.g., 100 sccm), and the pressure of the growth atmosphere is set to 3 Torr. The growth temperature is set to 450° C. to 475° C. The $SiH_4$ is mixed into the growth gas to suppress etching of silicon, which constitutes the high concentration impurity diffusion layer 18, caused by the reaction. The $N_2$ is mixed to improve the gas distribution.

Then, as shown in FIG. 3D, the second tungsten film 23 is grown by the diborane reduction method to have a thickness of 1500 nm. The flow rates of the gases being introduced into the growth atmosphere are set such that $WF_6$ is 10 to 50 sccm (e.g., 25 sccm), $H_2$ is 300 to 3000 scam (e.g., 1500 sccm), $B_2H_6$ is 0.2 to 10 sccm (e.g., 2 sccm), and Ar is 100 to 5000 sccm (e.g., 200 sccm), and the pressure of the growth atmosphere is lowered to 80 Torr. The growth temperature is set to 450° C. to 490° C. (e.g., 475° C.).

Then, the wiring layer, the passivation film, etc. are patterned via the well-known lithography step, whereby the semiconductor device can be fabricated.

In the above embodiment, since the tungsten film which is formed by the diborane reduction method to achieve the low resistivity is laminated on the tungsten film which is formed by the hydrogen reduction method to achieve the good coverage, not only the wiring resistance can be reduced rather than the case where the single wiring layer is formed by the tungsten film being formed by the hydrogen reduction method, but also the low contact resistance can be obtained stably rather than the case where the single wiring layer is formed by the tungsten film being formed by the diborane reduction method.

As a modification of the first embodiment, the growth of the first tungsten film 22 may be conducted by the hydrogen reduction method using the CVD while changing the conditions as two steps.

As the chemical vapor deposition conditions, gases which are introduced into the growth atmosphere for the lower layer portion of the first tungsten film 22 and their flow rates are given as follows. That is, $WF_6$ is 5 to 40 sccm (e.g., 10 sccm), $SiH_4$ is 1 to 10 sccm (e.g., 4 sccm), and $N_2$ or Ar is 50 to 500 sccm (e.g., $N_2$ is 300 sccm). The pressure of the atmosphere is lowered to 3 Torr. The growth temperature is set to 450° C. to 475° C. Under such conditions, the lower layer portion of the first tungsten film 22 is grown to have a thickness of 30 nm.

Then, gases which are introduced into the atmosphere to grow the upper layer portion of the first tungsten film 22 and their flow rates are given as follows. That is, $WF_6$ is 10 to 50 sccm (e.g., 25 sccm), $N_2$ is 30 to 300 scam (e.g., 300 sccm), and $H_2$ is 300 to 3000 sccm (e.g., 1800 sccm). The pressure of the atmosphere is lowered to 80 Torr. The growth temperature is set to 450° C. to 475° C. Under such conditions, the upper layer portion of the first tungsten film 22 is grown to have a thickness of 40 nm.

The subsequent growth of the second tungsten film 23 may be conducted under the same conditions as those in the above embodiment.

In this manner, the coverage of the first tungsten film 22 can be improved by forming the first tungsten film 22 with two steps.

In turn, a second embodiment of the present invention will be explained with reference to FIGS. 4A and 4C hereunder. In these figures, same references as those in FIGS. 3A to 3D denote the same elements as those in the first embodiment.

The second embodiment corresponds to the second invention. A feature of the second embodiment resides in that the method of forming the second tungsten film is changed.

Figure 4A:
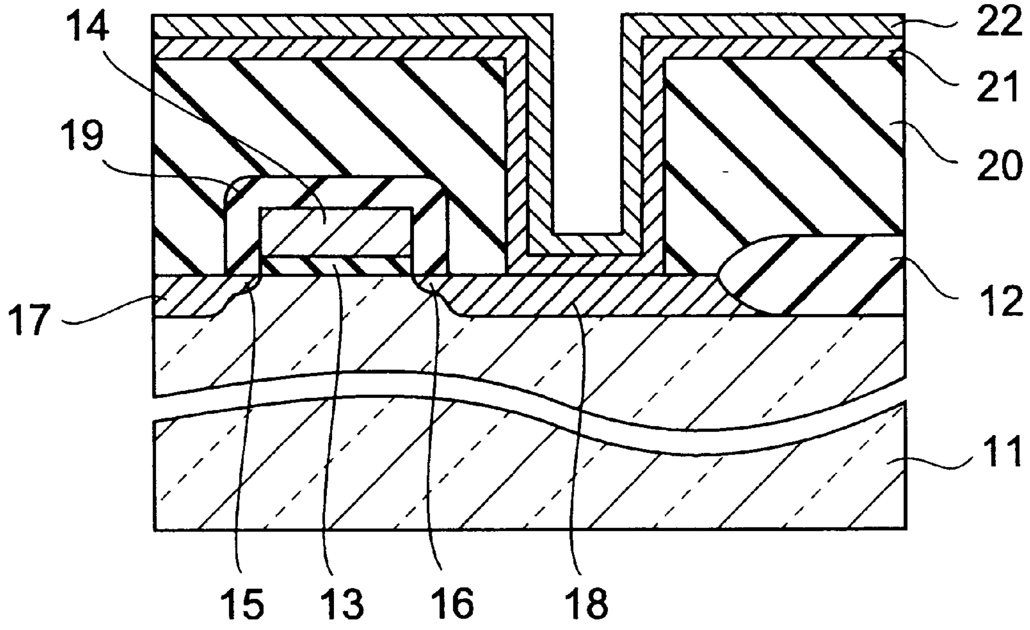
FIGS. 4A to 4C are sectional views showing the steps of manufacturing the semiconductor device according to the second embodiment of the present invention.
Figure 4B:
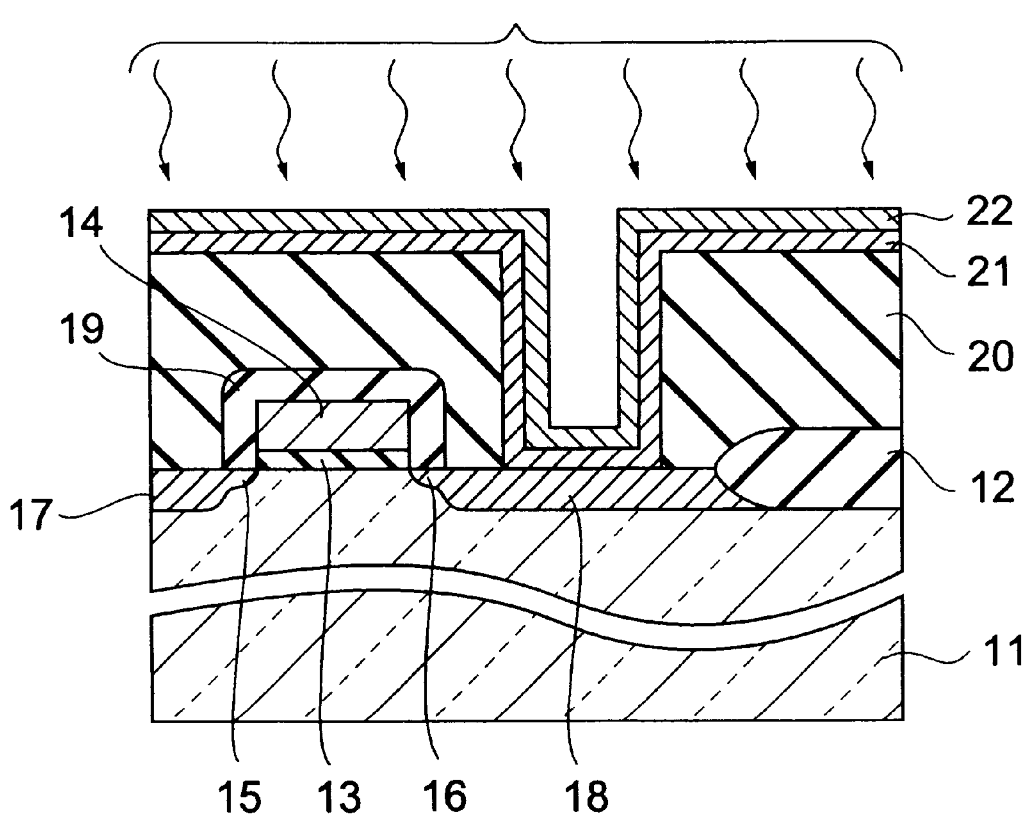
Figure 4C:
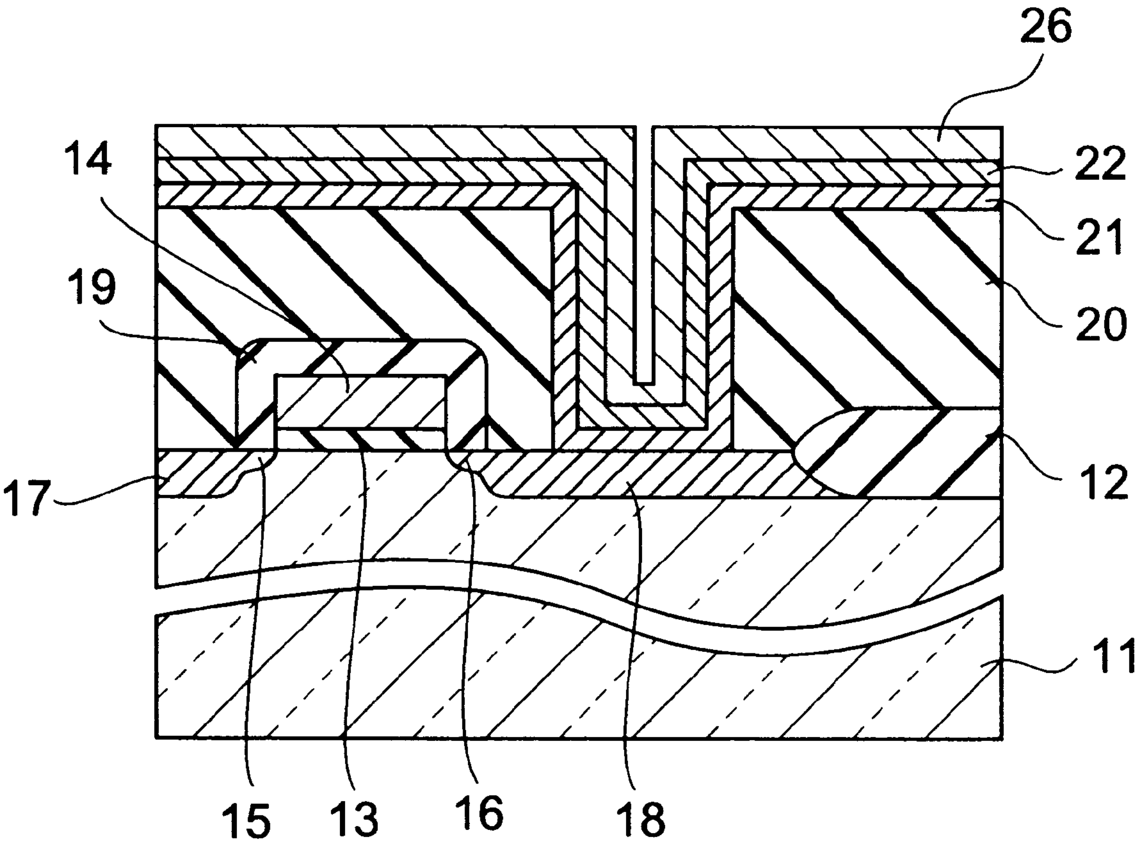

In FIG. 4C, the second tungsten film 26 formed on the first tungsten film is the tungsten film formed by the hydrogen reduction method.

Then, a semiconductor device manufacturing method according to the second embodiment of the present invention will be explained with reference to FIGS. 4A to 4C hereunder.

At first, as shown in FIG. 4A, the first tungsten film 22 is formed on the interlayer insulating film 20 including the contact portion by the same method as that explained in FIGS. 3A to 3D of the first embodiment.

Then, as shown in FIG. 4B, prior to formation of the second tungsten film 26, a gas 27 containing diborane is supplied onto the first tungsten film 22. In the conditions of the diborane process, as gas types and their gas flow rate, $H_2$ is 300 to 3000 sccm (e.g., 1500 sccm), $B_2H_6$ is 0.2 to 10 sccm (e.g., 2 sccm), and Ar is 100 to 5000 sccm (e.g., 200 sccm). The pressure of the atmosphere is lowered to 80 Torr. The substrate temperature is set to 450° C. to 475° C. The pressure of the atmosphere is lowered to 80 Torr. Under such conditions, the gases are supplied for 10 to 200 second (e.g., 60 second).

Then, as shown in FIG. 4C, the second tungsten film 26 of 150 nm thickness is formed by the hydrogen reduction method using the CVD. As the growth conditions, gas types and their gas flow rate are given such that $WF_6$ is 5 to 40 sccm (e.g., 25 sccm), $H_2$ is 300 to 3000 sccm (e.g., 1500 sccm), and Ar is 50 to 500 sccm (e.g., 200 sccm). The substrate temperature is set to 450° C. to 490° C. (e.g., 475° C.). The pressure of the growth atmosphere is lowered to 80 Torr.

Although the explanation will be omitted, the wiring layer, the passivation film, etc. are formed as in the first embodiment, whereby the semiconductor device is fabricated.

The hydrogen reduction method is employed as a method of forming the second tungsten film in the second embodiment, but the diborane reduction method using the CVD may be employed like the first embodiment. However, if the surface of the first tungsten film 20 is exposed to the diborane atmosphere before the formation of the second tungsten film 26, the second tungsten film having the low resistance can be formed by the hydrogen reduction method. Hence, since an advantage to improve the coverage in the contact hole 25 can also be achieved if the tungsten film is formed by the hydrogen reduction method along the second embodiment, the resistance of the contact portion can be reduced in contrast to the case where the diborane-reduced tungsten is employed as the second tungsten film.

With the above, the present invention has been explained based on the first and second embodiments. But, the present invention is not limited to these embodiments and various other modifications can be adopted. For example, although not clearly described in the above embodiments, the first tungsten film and the second tungsten film may be formed in the same chamber.

At this time, if the vacuum exhausting step is executed between the formation of the first tungsten film and the second tungsten film, replacement of the gas can be perfectly carried out, so that the stable film can be formed. Also, in the method described in the second embodiment, the change of temperature and the change of pressure around the substrate can be executed at the same time when the process is carried out by the diborane gas after the first tungsten film has been formed. Such processes are useful for shortening of the process time. In addition, it is evident that the present invention can be applied to not only the memory but also various semiconductor devices such as the logic and the logic with the memory.

Figure 5:
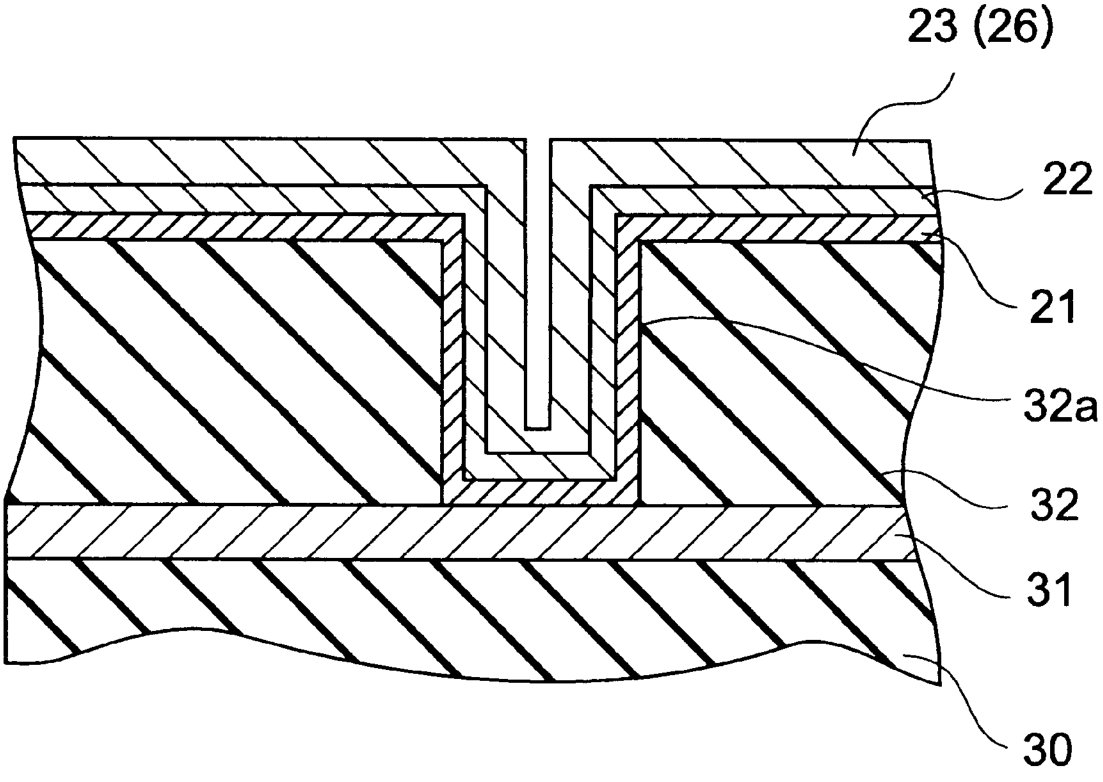
FIG. 5 is a sectional view showing a semiconductor device according to a first embodiment of the present invention.

Also, the tungsten wiring is connected to the impurity diffusion layer via the contact hole in the above embodiments. However, the wiring may be selected as the object to which the tungsten wiring is connected. That is, a via hole 329 may be formed in the interlayer insulating film 32 for covering the lower wiring 31, and then the tungsten film 23 or 26 may be formed on the interlayer insulating film 32 and in the via hole 32*a*, as shown in FIG. 5.

In the above embodiments, if the second tungsten wiring is formed thicker than the first tungsten wiring, the lower resistance of the tungsten wiring can be further improved while improving the coverage.

According to the present invention, since the resistance of the tungsten wiring layer can be made small, the contact resistance can be lowered, and the stable wiring width can be obtained, performances can be improved considerably such that the processing speed of the semiconductor device can be improved.

What is claimed is:

1. A semiconductor device manufacturing method comprising the steps of:

forming an insulating film on a conductive layer;

forming a hole in the insulating film located on the conductive layer;

forming a first tungsten film in the hole and on the insulating film by using a tungsten compound gas to react with hydride other than diborane, hydrogen, or these mixture; and forming a second tungsten film on the first tungsten film by using a gas containing diborane to react with the tungsten compound gas.

2. A semiconductor device manufacturing method according to claim 1, wherein the tungsten compound gas is tungsten hexafluoride.

3. A semiconductor device manufacturing method according to claim 1, further comprising the step of forming an adhesive layer for improving adhesiveness between the first tungsten film and the insulating film prior to formation of the first tungsten film.

4. A semiconductor device manufacturing method according to claim 3, wherein the adhesive layer is TiN, and further comprising the step of forming Ti below the adhesive layer.

5. A semiconductor device manufacturing method according to claim 1, wherein the second tungsten film is formed thicker than the first tungsten film.

6. A semiconductor device manufacturing method according to claim 1, wherein the conductive layer is formed of either an impurity diffusion layer formed on a semiconductor substrate or a wiring formed over the semiconductor substrate.

7. A semiconductor device manufacturing method comprising the steps of:

forming an insulating film on a conductive layer;

forming a hole in the insulating film located on the conductive layer;

forming a first tungsten film in the hole and on the insulating film by using a tungsten compound gas to react with hydride other than diborane, hydrogen, or these mixture;

exposing a surface of the first tungsten film to a gas containing the diborane; and forming a second tungsten film on the first tungsten film by using the hydride, the hydrogen, or these mixture to react with the tungsten compound gas on the first tungsten film which has been exposed to the gas containing the diborane.

8. A semiconductor device manufacturing method according to claim 7, wherein the tungsten compound gas is tungsten hexafluoride.

9. A semiconductor device manufacturing method according to claim 8, wherein the second tungsten film is formed by rendering hydride other than diborane, hydrogen, or these mixture to react with the tungsten compound gas.

10. A semiconductor device manufacturing method according to claim 8, wherein the second tungsten film is formed by rendering diborane to react with the tungsten compound gas.

11. A semiconductor device manufacturing method according to claim 7, wherein further comprising the step of forming an adhesive layer for improving adhesiveness between the first tungsten film and the insulating film prior to formation of the first tungsten film.

12. A semiconductor device manufacturing method according to claim 11, wherein the adhesive layer is TiN, and further comprising the step of forming Ti below the adhesive layer.

13. A semiconductor device manufacturing method according to claim 7, wherein the second tungsten film is formed thicker than the first tungsten film.

14. A semiconductor device manufacturing method according to claim 9, wherein the tungsten compound gas is tungsten hexafluoride.

15. A semiconductor device manufacturing method according to claim 10, wherein the tungsten compound gas is tungsten hexafluoride.

* * * * *